US006961995B2

(12) United States Patent
Jimarez et al.

(10) Patent No.: US 6,961,995 B2
(45) Date of Patent: Nov. 8, 2005

(54) METHOD OF MAKING AN ELECTRONIC PACKAGE

(75) Inventors: Lisa J. Jimarez, Newark Valley, NY (US); Miguel A. Jimarez, Newark Valley, NY (US); Voya R. Markovich, Endwell, NY (US); Cynthia S. Milkovich, Vestal, NY (US); Charles H. Perry, Poughkeepsie, NY (US); Brenda L. Peterson, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 10/251,072

(22) Filed: Sep. 19, 2002

(65) Prior Publication Data

US 2003/0020150 A1 Jan. 30, 2003

Related U.S. Application Data

(62) Division of application No. 09/761,124, filed on Jan. 16, 2001, now Pat. No. 6,486,415.

(51) Int. Cl.$^7$ .......................... H01K 3/10; H05K 7/12; B44C 1/22; C03C 15/00; C23E 1/00
(52) U.S. Cl. ...................... 29/852; 29/831; 29/832; 29/842; 29/845; 361/767; 216/72
(58) Field of Search .......................... 29/852, 842, 845, 29/831, 832; 361/767, 768, 719; 257/668, 678; 216/72, 78; 219/121, 71

(56) References Cited

U.S. PATENT DOCUMENTS

| | | | | |
|---|---|---|---|---|
| 3,602,635 A | * | 8/1971 | Romankiw | 174/253 |
| 4,289,719 A | * | 9/1981 | McIntosh et al. | 29/830 |
| 4,788,786 A | * | 12/1988 | Suter | 29/830 |
| 4,894,115 A | * | 1/1990 | Eichelberger et al. | 134/1.1 |
| 4,937,707 A | | 6/1990 | McBride et al. | 361/398 |
| 4,954,878 A | | 9/1990 | Fox et al. | 357/81 |
| 5,065,227 A | | 11/1991 | Frankeny et al. | 533/262 |
| 5,280,414 A | * | 1/1994 | Davis et al. | 361/795 |
| 5,362,656 A | | 11/1994 | McMahon | 437/21 |
| 5,386,341 A | | 1/1995 | Olson et al. | 361/749 |
| 5,406,446 A | * | 4/1995 | Peters et al. | 361/306.1 |
| 5,432,677 A | * | 7/1995 | Mowatt et al. | 361/719 |
| 5,517,754 A | | 5/1996 | Beilstein, Jr. et al. | 29/840 |
| 5,530,288 A | | 6/1996 | Stone | 257/700 |

(Continued)

FOREIGN PATENT DOCUMENTS

JP        63-307768        12/1988

OTHER PUBLICATIONS

IBM Technical Disclosure Bulletin, vol. 36, No. 7, Jul. 1993, pp. 137–138, "Interposer for Direct Chip Attach or Surface Mount Array Devices".

*Primary Examiner*—A. Dexter Tugbang
*Assistant Examiner*—Tai Nguyen
(74) *Attorney, Agent, or Firm*—John A. Jordan; William H. Steinberg

(57) ABSTRACT

An electronic package and method of making the electronic package is provided. A layer of dielectric material is positioned on a first surface of a substrate which includes a plurality of conductive contacts. At least one through hole is formed in the layer of dielectric material in alignment with at least one of the plurality of conductive contacts. A conductive material is positioned in the at least one through hole substantially filling the through hole. At least one conductive member is positioned on the conductive material in the through hole and in electrical contact with the conductive material. The electronic package improves field operating life of an assembly which includes a semiconductor chip attached to a second surface of the substrate and a printed wiring board attached to the conductive members.

3 Claims, 3 Drawing Sheets

U.S. PATENT DOCUMENTS

| | | |
|---|---|---|
| 5,553,769 A | 9/1996 | Ellerson et al. .......... 228/123.1 |
| 5,567,654 A | 10/1996 | Beilstein, Jr. et al. ...... 437/209 |
| 5,770,476 A | 6/1998 | Stone ......................... 438/106 |
| 5,781,413 A | 7/1998 | Howell et al. ............... 361/777 |
| 5,786,628 A | 7/1998 | Beilstein, Jr. et al. ...... 257/684 |
| 5,798,563 A * | 8/1998 | Feilchenfeld et al. ....... 257/668 |
| 5,822,856 A | 10/1998 | Bhatt et al. .................... 29/832 |
| 5,926,029 A | 7/1999 | Ference et al. ............. 324/762 |
| 5,972,734 A | 10/1999 | Carichner et al. .......... 438/106 |
| 5,973,391 A | 10/1999 | Bischoff et al. ............ 257/678 |

\* cited by examiner

METHOD OF MAKING AN ELECTRONIC PACKAGE

CROSS REFERENCE TO COPENDING APPLICATION

This application is divisional application of Ser. No. 09/761,124, filed Jan. 16, 2001. Now U.S. Pat. No. 6,486,415.

FIELD OF THE INVENTION

The present invention relates to an electrical interconnection arrangement for making connection between electronic substrates and, more particularly, to making electrical interconnection between a chip carrier and a printed wiring board.

BACKGROUND OF THE INVENTION

One of the problems encountered with some chip carrier substrate interconnections to the next level of packaging is the high stress on the interconnections caused by coefficient of thermal expansion (CTE) mismatch between the substrate and the next level of packaging. The CTE thermal mismatch is particularly large where a ceramic chip carrier substrate is connected to a printed wiring board typically made of an epoxy/glass material. When a high circuit density chip is attached to the chip carrier substrate, the heat generated by the chip compounds the CTE mismatch problem between the chip carrier substrate and the printed wiring board because of large temperature variations between the chip and the printed wiring board. In addition, certain applications, such as flip chip applications, have required encapsulation to ensure a reliable flip chip interconnection in the solder joints between the chip and the substrate. Such encapsulation typically employs a high strength epoxy which acts to reinforce the bond between the chip and the chip carrier substrate. During thermal cycling, this reinforcing of the chip to chip carrier substrate reduces solder joint stress between the chip and the chip carrier. When coupled with the CTE mismatch between a ceramic chip carrier attached by a solder interconnection to a printed wiring board, this reinforcement can cause high stress between the ceramic chip carrier substrate and the printed wiring board to which it is attached. Repeated thermal cycling can lead to cracking of the solder interconnection between the ceramic chip carrier and the printed wiring board, ultimately affecting reliability of the chip/substrate/printed wiring board package.

The above described high stresses on the solder interconnections are generally attributed to the fact that the bonding of chip to the ceramic chip carrier, including the encapsulant, forms a composite which acts during thermal cycling to cause this composite to act like a "bimetallic" element wherein the composite bends due to the different CTE of the materials. As a result of the large thermal mismatch between the composite and the printed wiring board, the thermal cycling induced bending over time can cause solder interconnection failure. In this regard, the CTE for a typical chip may be in the order of about 3 parts per million per degree Centigrade (ppm/degree C.). The CTE for a typical ceramic chip carrier may be in the order of about 3–5 ppm/degree C., while a typical printed wiring board CTE may be about 18–22 ppm/degree C.

In general, others have attempted to address the problems caused by CTE mismatch of materials in electronic packages by providing various interposing structures that attempt to reduce the CTE mismatch. For example, multiple layers of materials with varying CTEs may be employed to form an interposing layer between one level of packaging and the next, with the layers having a gradation of CTEs such that the layer contacting one level of packaging is selected to have a CTE which more closely matches the CTE of that level while the layer contacting the next level of packaging has a CTE more closely matching that level while layers between may gradually reduce the difference. In addition, efforts have also been made to use interposing layers which are flexible in nature such as to reduce the stress on electrical interconnections during thermal cycling created by thermal mismatch. However, these various efforts typically are either difficult to assemble or are not totally effective in their purpose.

The present invention is directed at overcoming the problems set forth above. It is desirable to have an electronic package and method to make the electronic package that significantly absorbs the stresses that occur between a chip carrier and a printed wiring board during thermal cycling. Electronic packages produced by this method will have increased operational field life.

SUMMARY OF THE INVENTION

Accordingly, it is the object of this invention to enhance the art of packaging technology.

It is another object of this invention to provide a novel method of producing an electronic package that provides an improved interconnection between a chip carrier substrate and a printed wiring board.

It is yet another object of this invention to provide an electronic package that will be manufactured with relatively lower costs than many current products.

Still another object of this invention to provide an electronic package having a layer of dielectric material between a chip carrier substrate and printed wiring board that substantially absorbs stress caused by thermal cycling resulting in a package having much improved operational field life.

Still yet another object of this invention is to provide an electronic package having at least one through hole in a layer of dielectric material substantially filled with a conductive material and having a conductive member positioned on the conductive material.

According to one aspect of the invention, there is provided an electronic package comprising a substrate having a first surface, the first surface having a plurality of conductive contacts thereon and a layer of dielectric material having a first and second surface, the first surface of the dielectric material positioned substantially on the first surface of said substrate. At least one through hole is positioned in the layer of dielectric material substantially aligned with at least one of the plurality of the conductive contacts, the at least one through hole having a side wall. A conductive material is positioned in the at least one through hole, the conductive material substantially filling the through hole and being in electrical contact with the at least one of the plurality of conductive contacts, and at least one conductive member positioned on the conductive material in the at least one through hole and in electrical contact with the conductive material.

According to another aspect of the invention, there is provided a method of making an electronic package comprising the steps of providing a substrate having a first surface, the first surface having a plurality of conductive contacts thereon, positioning a layer of dielectric material having a first and second surface substantially on the first surface of the substrate, and forming at least one through hole in the layer of dielectric material in alignment with the at least one of the plurality of said conductive contacts, the at least one through hole having a side wall. The method includes positioning a conductive material in the at least one through hole so as to substantially fill the through hole and to be in electrical contact with the at least one of the plurality of conductive contacts, and positioning at least one conductive member on the conductive material in the at least one through hole and in electrical contact with the conductive material.

The above objects, advantages, and features of the present invention will become more readily apparent from the following detailed description of the presently preferred embodiments as illustrated in the accompanying drawings.

BEST MODE FOR CARRYING OUT THE INVENTION

Figure 1:
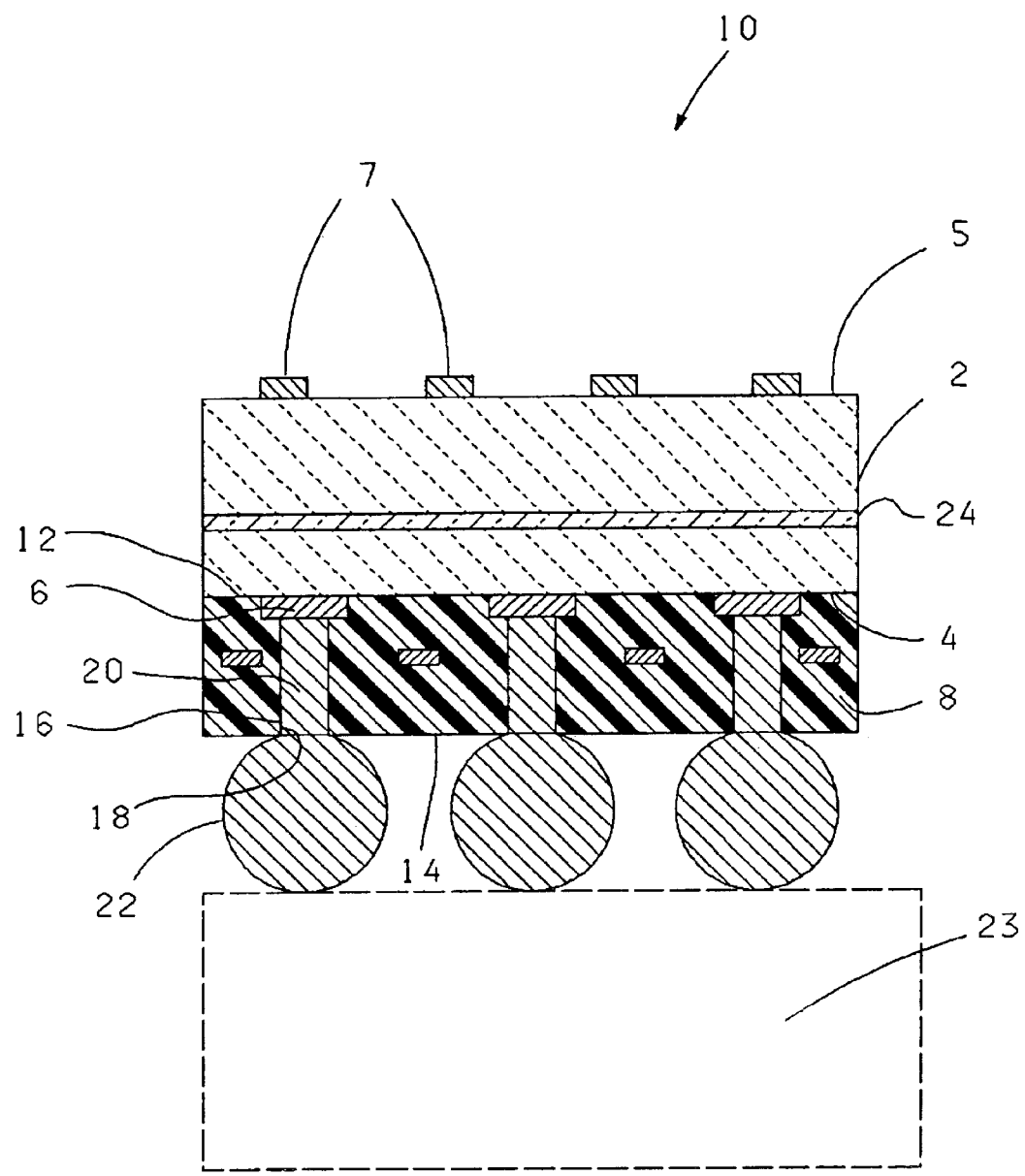
FIG. 1 is a sectional view in elevation of one embodiment of the electronic package of the present invention, illustrating a substrate assembled to a printed wiring board, the substrate having a layer of dielectric material thereon, the layer of dielectric material having through holes filled with conductive material. Conductive members are positioned on the conductive material.

An electronic package 10 embodying the present invention is shown in FIG. 1. Electronic package 10 includes a substrate 2 with a first surface 4. First surface 4 has a plurality of conductive contacts 6 thereon. Another surface 5 of substrate 2 can include a plurality of contacts 7 adapted for bonding an electrical element such as an electrical component (not shown) thereon. One example of such a component is a semiconductor chip. A layer of dielectric material 8 having a first surface 12 and a second surface 14 is positioned substantially on first surface 4 of substrate 2. A plurality of through holes 16 each with a side wall 18 are positioned in layer of dielectric material 8. Through holes 16 are substantially aligned with the plurality of conductive contacts 6. Conductive material 20 is positioned in through holes 16. Conductive material 20 substantially fills through holes 16 and is in electrical contact with plurality of conductive contacts 6. Conductive members 22 are positioned on conductive material 20 and make electrical contact with conductive material 20 in through holes 16. Conductive members 22 are adapted for electrical connection to a printed wiring board 23, shown in phantom.

Substrate 2 is preferably comprised of a ceramic material. Examples of ceramic materials that can be used in this invention include aluminum silicate and aluminum oxides. The substrate can include at least one layer 24 of glass, examples of which are silicon oxides and silicates.

Layer of dielectric material 8 may be comprised of a material selected from the group consisting of fluoropolymers, allyated polyphenyl esters, and cyanate ester epoxys. The fluoropolymer polytetrafluoroethylene is preferred in this invention. A suitable polytetrafluoroethylene is available under the product name RO 2800 from Rogers Corporation (Rogers, Conn.). The allyated polyphenyl esters employed in this invention are produced by polymerization of unsaturated allyated polyphenyl ester compounds to form a cross linked thermosetting resin which is highly resistant to chemical attack, moisture absorption, and heat. These resins also exhibit low shrinkage and good electrical resistivity. The allyl group can be of the form $CH_2=CH_2$ or $CH_2=C-R$ where R can be any length of carbon atoms. The cyanate esters that can be employed pursuant to the present invention have two or more ——O——CHN groups and are curable through the cyclotrimerization reaction. The cyanate esters can be monomeric or less preferably polymeric, including oligomers and can be represented by those materials containing the following group:

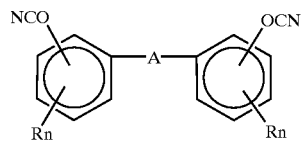

where A represents independently a single bond, ——C$(CH_3)(H)$——, ——$SO_2$——, ——O——, ——$C(CF_2)_2$——, ——$CH_2OCH_2$——, ——S——, ——C(=O)——. ——O——C(=O)——O——, ——S(=O)——, ——O——P(=O)——O——, ——O——P(=O)(=O)——O——, divalent alkylene radicals such as ——$CH_2$—— and ——$C(CH_3)_2$——; divalent alkylene radicals interrupted by heteroatoms in the chain such as O, S, and N.

Each R is independently selected from the group of hydrogen, alkyl containing 1 to 9 carbon atoms: each n independently is an integer of 0 to 4.

Other cyanates useful in the method and structure of the invention can be prepared by well known methods, for example, by reacting the corresponding polyvalent phenol with a halogenated cyanate, as described in U.S. Pat. Nos. 3,553,244; 3,740,348; and 3,755,402.

The phenol reactant can be any aromatic compound containing one or more reactive hydroxyl groups. The phenolic reactant is preferably a di- or tri-polyhydroxy compound of the formula:

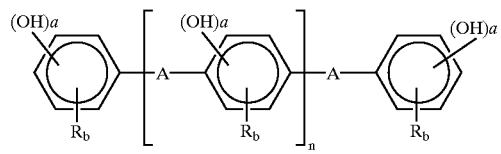

in which each a and b is independently 0, 1, 2, or 3, and at least one a is not 0; n is within the range of 0 to about 8, preferably 0 to 3; each R is independently selected from non-interfering alkyl, aryl, alkaryl, heteroatomic, heterocyclic, carbonyloxy, carboxy, and the like ring substituents, such as hydrogen, $C_{1-6}$ alkyl, $C_{1-6}$ allyl, $C_{1-6}$ alkoxy, halogen, maleimide, propargyl ether, glycidyl ether, and the like; and A is a polyvalent linking moiety which can be, for example, aromatic, aliphatic, cycloaliphatic, polycyclic, and heteroatomic. Examples of linking moiety A include ——O——, ——$SO_2$——, ——CO——, ——OCOO——, ——S——, ——$C_{1-12}$——, dicyclopentadienyl, aralkyl, aryl, cycloaliphatic, and a direct bond.

Specific cyanate esters that can be employed in the present invention are available and well-known and include those discussed in the U.S. Pat. Nos. 4,195,132; 3,681,292; 4,740,584; 4,745,215; 4,477,629; and 4,546,131; European patent application EP0147548/82; and German Offen. 2611796, disclosures of which are incorporated herein by reference. A preferred polyfunctional cyanate ester is Bisphenol AD dicyanate (4.4'-ethylidenebisphenoldicyanate) available from Vantico Corporation under the trade designation AROCY L-10 hexafluoro bisphenol A dicyanate (Arocy-40S), and bisphenol M dicyanate (RTX366) commercially available from Vantico Corporation. The layer of dielectric material 8 is comprised of a material having an elastic modulus of from about 50,000 pounds per square inch (psi) to about 300,000 psi. The modulus of elasticity is sometimes referred to as the Young's modulus. The modulus of elasticity can be thought of as stiffness of a material or its resistance to elastic deformation. The greater the elastic modulus, the stiffer the material or the smaller the elastic strain that results from the application of a given stress. When layer of dielectric material 8 is comprised of a material with this modulus of elasticity, it is relatively compliant and warpage between substrate 2 and conductive members 22 during operation of the electronic package is greatly reduced.

Figure 2:
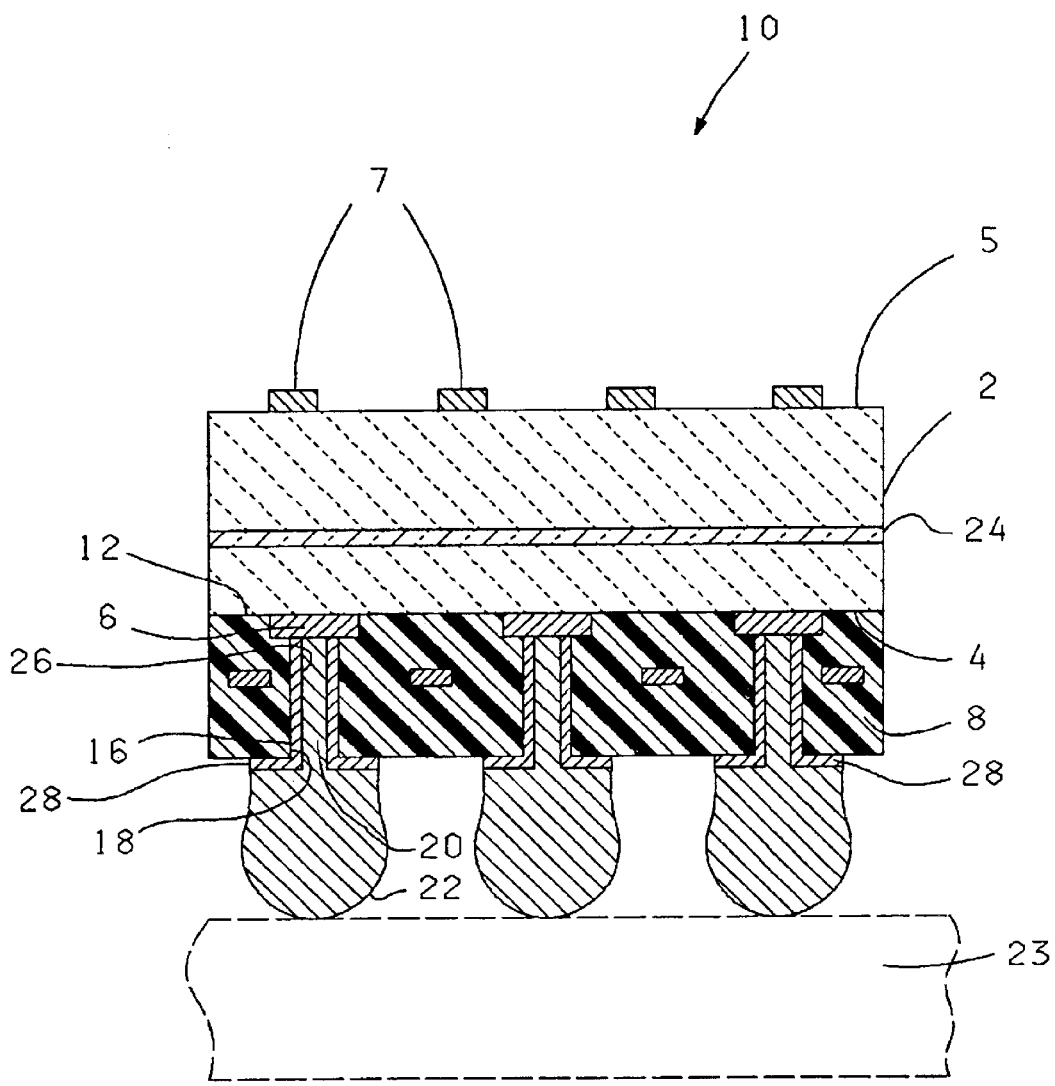
FIG. 2 is a sectional view in elevation of another embodiment of the electronic package of the present invention, illustrating conductive members in electrical contact with conductive pads and the conductive material substantially filling the through holes.

Referring to FIG. 2, plurality of through holes 16 can include at least one through hole with a layer of plated material 26 on side wall 18. Layer of plated material 26 is selected from the group consisting of copper, lead, nickel, gold, palladium, and tin. Conductive material 20 can be positioned on side wall 18 of plurality of through holes 16 or on layer of plated material 26. Conductive material 20 is selected from the group consisting of eutectic solder, high melt solders, lead free solders or conductive inks. One example of a eutectic solder is one including about 63% tin and about 37% lead having a melting point of about 183 degrees C. One example of a high melt solder is solder having a composition of about 90% to about 97% lead with the balance comprising tin. Another example of a high melt solder is known as 90/10 solder, defined as about 90% by weight lead and about 10% by weight tin. Minimum melting points for high melt solders having these compositions range from about 268 degrees C. to about 314 degrees C. Lead free solders can include an element selected from the group consisting of tin, bismuth, indium, silver, antimony, and copper. For example, one solder used in this invention is a lead free solder comprising about 3.8% silver, about 0.7% to about 0.9% copper, with the remainder tin. Conductive inks include, but are not limited to particles of silver, gold, graphite polymer, or copper suspended in an organic liquid carrier. Some examples of conductive inks that can be employed in this invention are available from Conductive Compounds, Londonderry, N.H., under the product names AG-500, EP-600, UV-1009, and C-100.

Through holes 16 substantially filled with conductive material 20 form columns of conductive material which tend to function as stress relieving "springs". When conductive members 22 are connected to printed wiring board 23, the compliant layer of dielectric material 8 and columns of conductive material 20 together absorb stresses between substrate 2 and printed wiring board 23 to assure substantial prevention of failure of conductive members 22 due to the mismatch of CTEs between substrate 2 and printed wiring board 23 during thermal cycling associated with field operation.

Solder member 22 preferably comprises a solder ball. The solder ball is comprised of a high melt solder of the type previously described. On second surface 14 of dielectric material 8 conductive pads 28 may be positioned. Conductive pads 28 are in electrical contact with both conductive material 20 and conductive members 22.

Figure 3:
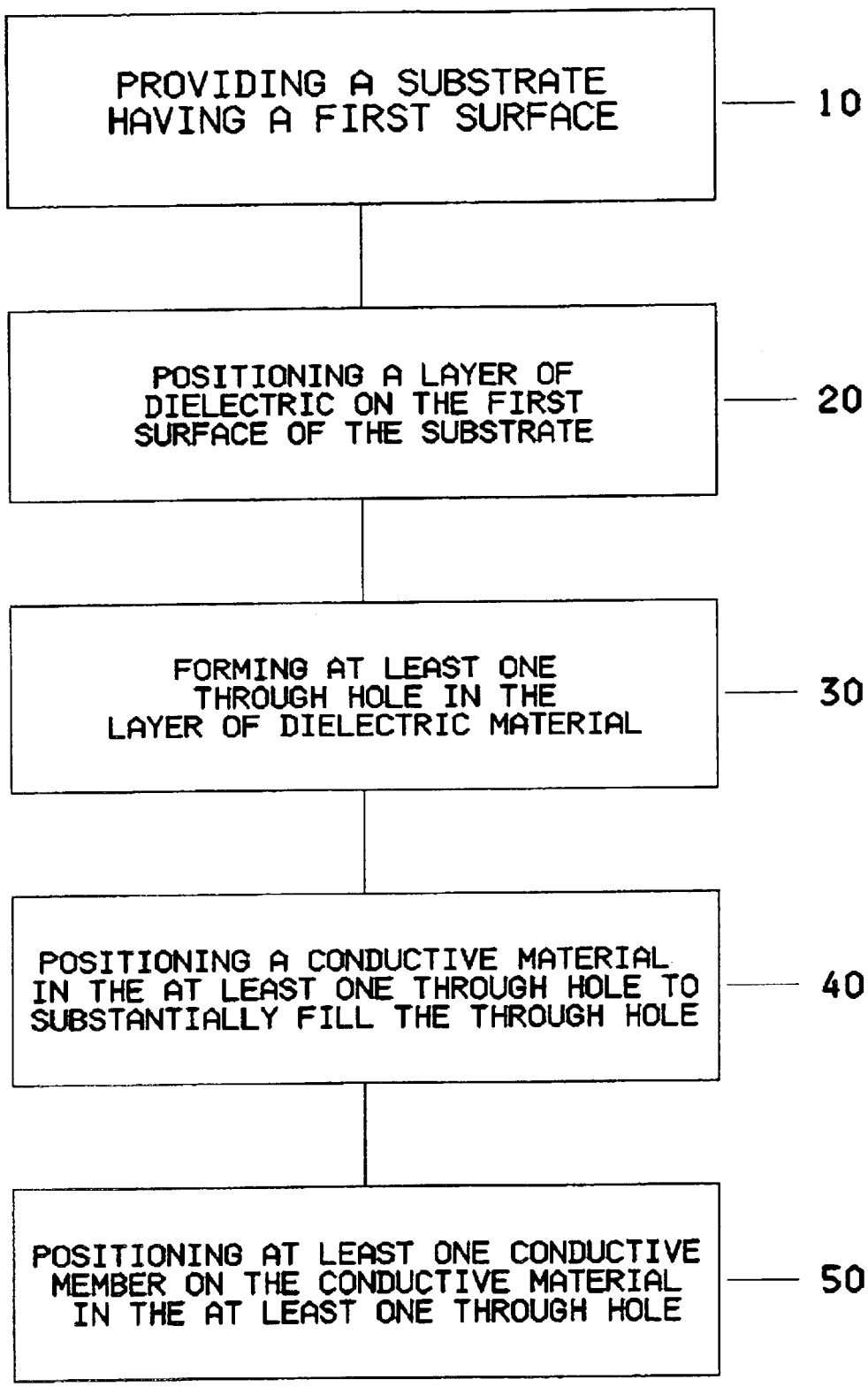
FIG. 3 is a flow diagram of the steps carried out in making an electronic package, in accordance with one embodiment of the present invention.

FIG. 3 illustrates the various steps involved in making an electronic package according to one aspect of the present invention. A substrate is provided, as depicted in Block 10, the substrate having a first surface with a plurality of conductive contacts thereon.

As depicted in Block 20, a layer of dielectric material is then positioned substantially on the first surface of the substrate, the layer of dielectric material having a first and second surface.

Block 30 describes the step of forming at least one through hole in the dielectric layer in alignment with the at least one of the plurality of conductive contacts, the at least one through hole having a side wall. Alternatively, the dielectric layer can be formed with a through hole therein and then laminated on the first surface of the substrate. This is accomplished by first laminating a layer of organic polymeric material, such as polytetrafluoroethylene, allyated polyphenyl ester or cyanate ester resin, onto both sides of a first metal layer, the first metal layer including a clearance hole formed by etching. A second layer of metal, having a preselected thickness is then positioned on one of the surfaces of the layer of organic material. This surface is defined as the second surface of the layer of dielectric material. The preselected thickness of the second metal layer being about 0.0003 inches to about 0.0006 inches. A portion of the second layer of metal is then removed to reduce the preselected thickness to about 3 microns. At least one through hole having a side wall is then formed in the layer of dielectric material by the step of laser drilling at the location of the clearance hole so that the through hole passes through the clearance hole. The first surface of the layer of dielectric material is then positioned on the first surface of the substrate so that the at least one through hole in the dielectric layer is in alignment with at least one of the plurality of conductive contacts. The layer of dielectric material is then laminated to the first surface of the substrate.

As depicted in Block 40, a conductive material is positioned in the at least one through hole so as to substantially fill the through hole and to be in electrical contact with at least one of the plurality of conductive contacts. The conductive material is positioned in the through hole by the step of screening. The reduced thickness second layer of metal functions as a mask, later removed by flash etching. The side wall of the at least one through hole can be plated with a layer of plated material prior to screening of the conductive material. When the side wall of the at least one through hole includes a layer of plated material, the reduced thickness layer of metal is removed from the surface of the organic polymeric material by flash etching prior to screening the conductive material into the at least one through hole.

Block 50 describes the step of positioning at least one conductive member on the conductive material in the at least one through hole and in electrical contact with the conductive material. The at least one conductive member is positioned by placing a high melt solder ball on the screened conductive material in the through hole. The substrate is then placed in a solder reflow oven where the screened conductive material is reflowed forming a solder joint with the high melt solder ball with does not undergo solder reflow.

In summary, the defined package structures and methods of forming same provide an electronic package that is more reliable in operating field life because the stresses that occur between the substrate and the printed wiring board during thermal cycling are absorbed by a combination of a compliant layer of dielectric material and conductive columns. This is uniquely accomplished by positioning a layer of compliant dielectric material on a surface of a substrate, the surface of the substrate having a plurality of conductive contacts thereon, forming at least one through hole in the layer of dielectric material in alignment with at least one of the plurality of the conductive contacts, and positioning a conductive material in the at least one through hole so as to substantially fill the through hole. The conductive material forms conductive columns for a conductive member positioned thereon. During thermal cycling the compliant dielectric material and "spring-like" columns serve to absorb stresses caused by the CTE mismatch between the substrate and a printed wiring board during thermal cycling. The product made with the unique teachings described herein will have improved operational field life.

While there have been shown and described what the present considered preferred embodiments of the invention, it will be obvious to those skilled in the art that various changes and modifications may be made therein without departing from the scope of the invention as defined by the appended claims.

What is claimed is:

1. A method of making an electronic package comprising the steps of:

providing a substrate having a first surface, said first surface having a plurality of conductive contacts thereon;

positioning a layer of dielectric material having a first and second surface substantially on said first surface of said substrate, said layer of dielectric material formed by laminating a layer of an organic polymeric material onto a first metal layer, said first metal layer including at least one clearance hole therein, and positioning a second layer of metal having a preselected thickness on one surface of said layer of organic polymeric material and then removing a portion of said second layer of metal to reduce said preselected thickness, said second layer of metal and said first metal layer being separated by said layer of organic polymeric material;

forming at least one through hole in said layer of dielectric material in alignment with said at least one of said plurality of said conductive contacts, said at least one through hole having a side wall;

removing said second layer of metal from said one surface of said organic polymeric material;

screening a conductive material in said at least one through hole so as to substantially fill said through hole and to be in electrical contact with said at least one of said plurality of conductive contacts; and positioning at least one conductive member on said conductive material in said at least one through hole and electrical contact with said conductive material.

2. The method of making the electronic package of claim 1 further including the step of plating a layer of copper on said side wall of said at least one through hole prior to removing said second layer of metal from said one surface of said organic polymeric material.

3. A method of making an electronic package comprising the steps of:

providing a substrate having a first surface, said first surface having a plurality of conductive contacts thereon;

positioning a layer of dielectric material having a first and second surface substantially on said first surface of said substrate;

forming at least one through hole in said layer of dielectric material in alignment with said at least one of said plurality of said conductive contacts, said at least one through hole having a side wall;

positioning a conductive material in said at least one through hole so as to substantially fill said through hole and to be in electrical contact with said at least one of said plurality of conductive contacts; and positioning a high melt solder ball on said conductive material in said at least one through hole and in electrical contact with said conductive material.

* * * * *